United States Patent
Chang

(10) Patent No.: US 11,889,638 B2
(45) Date of Patent: *Jan. 30, 2024

(54) ELECTRONIC APPARATUS

(71) Applicant: InnoLux Corporation, Miao-Li County (TW)

(72) Inventor: Chi-Liang Chang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/751,954

(22) Filed: May 24, 2022

(65) Prior Publication Data

US 2022/0287190 A1    Sep. 8, 2022

Related U.S. Application Data

(60) Continuation of application No. 16/904,642, filed on Jun. 18, 2020, now Pat. No. 11,375,625, which is a
(Continued)

(30) Foreign Application Priority Data

Sep. 26, 2018   (CN) .......................... 201811124529.9

(51) Int. Cl.
  *H05K 5/00*     (2006.01)
  *H05K 5/02*     (2006.01)

(52) U.S. Cl.
  CPC ......... *H05K 5/0021* (2013.01); *H05K 5/0017* (2013.01); *H05K 5/0247* (2013.01)

(58) Field of Classification Search
  CPC ... H05K 5/0021; H05K 5/0017; H05K 5/0247
  See application file for complete search history.

(56) References Cited

U.S. PATENT DOCUMENTS 6,808,400 B2 * 10/2004 Tu ...................... H01R 13/4538
                                                       439/131
9,151,060 B2 * 10/2015 Khongbantabam .........................
                                                       E04F 13/0894
(Continued)

FOREIGN PATENT DOCUMENTS

CN       201868037 U     6/2011
CN       103017017 A     4/2013
(Continued)

OTHER PUBLICATIONS

Chinese language office action dated Nov. 21, 2022, issued in application No. CN 202111041910.0.
(Continued)

*Primary Examiner* — Abhishek M Rathod
(74) *Attorney, Agent, or Firm* — McClure, Qualey & Rodack, LLP

(57) ABSTRACT

A display apparatus includes a fixing frame, a first display device, and a second display device. The first display device is disposed on the fixing frame, and includes a first upper electrical connector. The second display device is disposed on the fixing frame, wherein the second display device includes a first lower electrical connector and a first lower receiving part. When the first upper electrical connector of the first display device is electrically connected to the first lower electrical connector of the second display device, the first upper electrical connector is disposed in the first lower receiving part.

7 Claims, 13 Drawing Sheets

Related U.S. Application Data division of application No. 16/357,498, filed on Mar. 19, 2019, now Pat. No. 10,729,020.

(60) Provisional application No. 62/659,784, filed on Apr. 19, 2018.

(56) References Cited

U.S. PATENT DOCUMENTS

| | | | |
|---|---|---|---|
| 9,660,403 | B2 | 5/2017 | Hochman et al. |
| 2004/0077216 | A1 | 4/2004 | Tu |
| 2013/0293443 | A1 | 11/2013 | Seo et al. |
| 2014/0012641 | A1 | 1/2014 | Birch |
| 2014/0193193 | A1* | 7/2014 | Wikander ............. G06F 1/1679 403/322.1 |
| 2015/0187241 | A1 | 7/2015 | Hall |
| 2015/0277491 | A1* | 10/2015 | Browning ............. G06F 1/1632 248/346.03 |
| 2017/0093106 | A1* | 3/2017 | Hochman ................ G09G 5/02 |

FOREIGN PATENT DOCUMENTS

| | | |
|---|---|---|
| CN | 104617426 A | 5/2015 |
| CN | 106558291 A | 4/2017 |

OTHER PUBLICATIONS

Chinese language office action dated Nov. 22, 2022, issued in application No. CN 202111041903.0.

Chinese language office action dated Apr. 13, 2023, issued in application No. CN 202111041910.0.

Chinese language office action dated May 6, 2023, issued in application No. CN 202111041903.0.

Chinese language office action dated Aug. 4, 2023, issued in application No. CN 202111041910.0.

* cited by examiner

ELECTRONIC APPARATUS

CROSS-REFERENCE TO RELATED APPLICATIONS

This application is a Continuation of application Ser. No. 16/904,642, filed Jun. 18, 2020, now U.S. Pat. No. 11,375,625, which is a divisional application of U.S. application Ser. No. 16/357,498, filed Mar. 19, 2019, now U.S. Pat. No. 10,729,020, which claims the benefit of U.S. Provisional Application No. 62/659,784, filed on Apr. 19, 2018, the entirety of which are incorporated by reference herein. This Application claims priority of China Patent Application No. 201811124529.9 filed on Sep. 26, 2018, the entirety of which is incorporated by reference herein.

BACKGROUND

Field of the Disclosure

The present disclosure relates to a display apparatus, and in particular to a display apparatus with display devices.

Description of the Related Art

In recent years, display screens have been widely used to dynamically display advertisements. However, due to the size of these display screens, it is difficult to display an advertisement on a large area using a single display screen.

In order to solve the above problems, in the prior art, multiple display screens are connected into one screen wall to display large-area advertisements. However, the assembly of conventional display screens is complicated, and multiple display lines are required to provide power and signals to each display screen. Moreover, it is difficult to align the display surfaces of the display screens on the same plane, which increases the time it takes to assemble the screen wall.

Accordingly, although existing screen walls have been generally adequate for their intended purposes, they have not been entirely satisfactory in all respects. Consequently, it would be desirable to provide a solution for improving the screen walls.

BRIEF SUMMARY

During assembly of the display devices, the display apparatus of the present disclosure may not need additional connection lines to connect to the display devices 20, thereby reducing the complexity of assembling the display apparatus 1. Moreover, the display apparatus utilizes the limit mechanisms between the display devices to align the display devices, thereby reducing the time required to assemble the display apparatus 1.

The present disclosure provides a display apparatus including a fixing frame, a first display device, and a second display device. The first display device is disposed on the fixing frame, and includes a first upper electrical connector. The second display device is disposed on the fixing frame, wherein the second display device includes a first lower electrical connector and a first lower receiving part. When the first upper electrical connector of the first display device is electrically connected to the first lower electrical connector of the second display device, the first upper electrical connector is disposed in the first lower receiving part.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
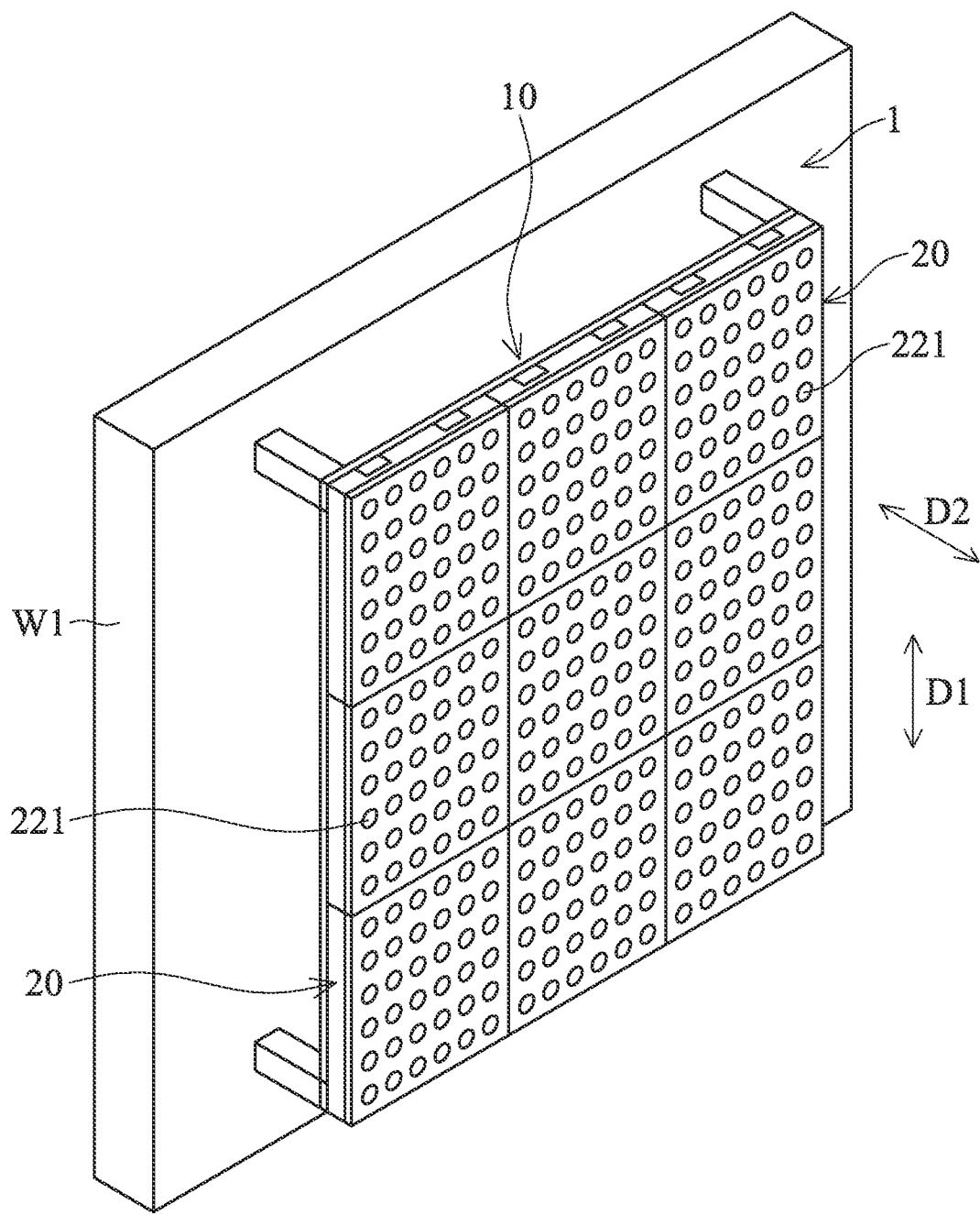
FIG. 1 is a perspective view of the display apparatus in accordance with the first embodiment of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

The words, such as "first" or "second", in the specification are for the purpose of clarity of description only, and are not relative to the claims or meant to limit the scope of the claims. In addition, terms such as "first feature" and "second feature" do not indicate the same or different features.

Spatially relative terms, such as upper and lower, may be used herein for ease of description to describe one element or feature's relationship to other elements or features as illustrated in the figures. The spatially relative terms are intended to encompass different orientations of the device in use or operation in addition to the orientation depicted in the figures. Moreover, the shape, size, and thickness depicted in the drawings may not be drawn to scale or may be simplified for clarity of discussion; these drawings are merely intended for illustration.

Figure 2:
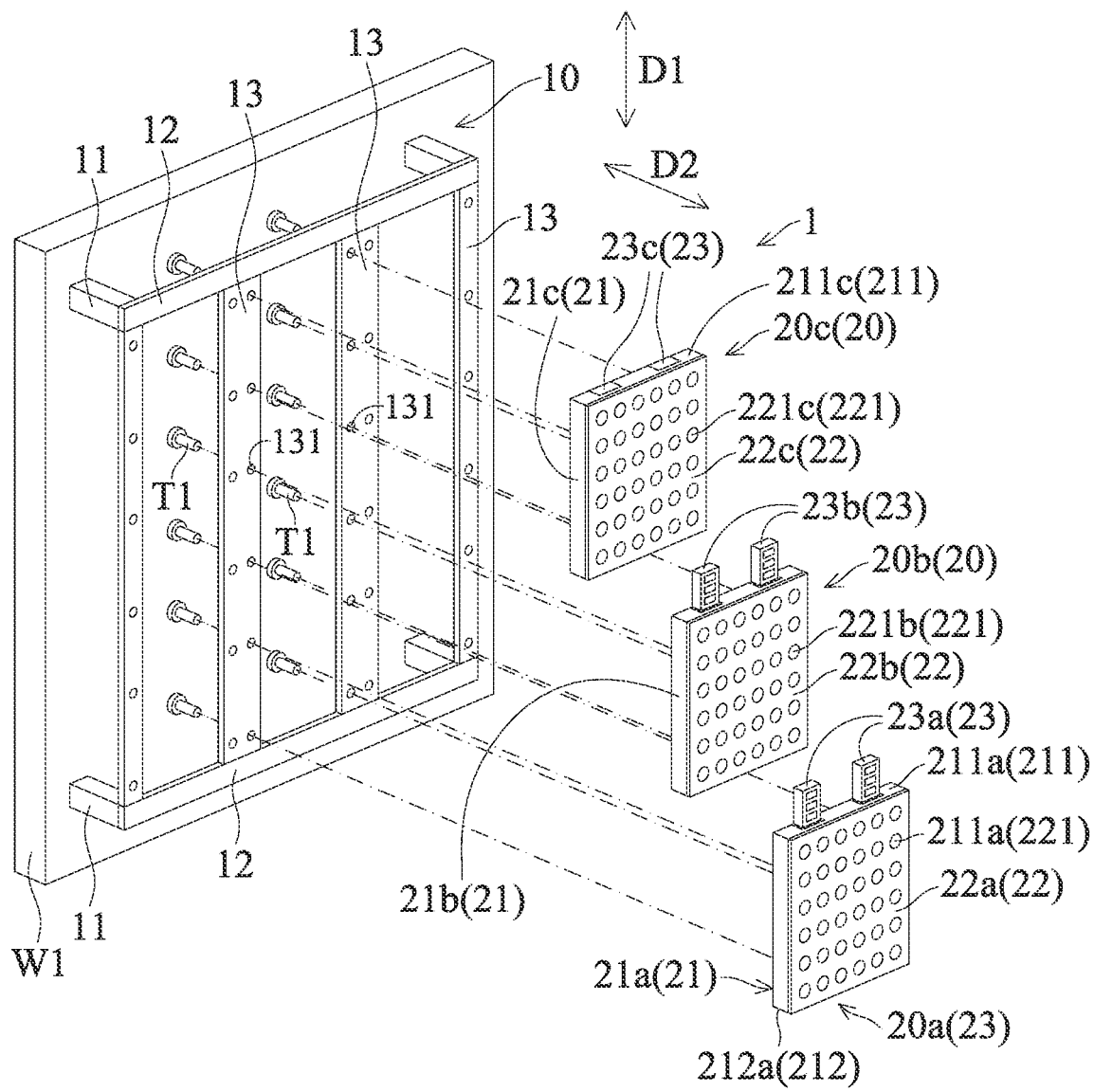
FIG. 2 is an exploded view of the display apparatus in accordance with the first embodiment of the present disclosure.

FIG. 1 is a perspective view of the display apparatus 1 in accordance with the first embodiment of the present disclosure. FIG. 2 is an exploded view of the display apparatus 1 in accordance with the first embodiment of the present disclosure. For the purpose of clarity, three display devices 20 are shown in FIG. 2. The display apparatus 1 may be a video wall disposed on a wall W1. The display apparatus 1 includes a fixing frame 10 and display devices 20. The fixing frame 10 may be affixed to the wall W1.

The fixing frame 10 includes fixed posts 11, fixed rods 12, and fixed rods 13. The fixed posts 11 may be affixed to the wall W1. The fixed rods 12 may be affixed to the fixed posts 11, and the fixed rods 13 may be affixed to the fixed rods 12.

In some embodiments, the fixed posts 11 may extend perpendicular to the wall W1. The fixed rods 13 may be perpendicular to the fixed rods 12, and parallel to each other. In the embodiment, the fixed rods 12 and the fixed rods 13 may be separated from the wall W1 in order to facilitate the construction workers to affix the display device 20 to the fixed rods 13.

In the embodiment, the fixed rods 13 may extend in a first direction D1. Each of the fixed rods 13 has fastening holes 131 arranged in the first direction D1. Fixing elements T1 may pass through the fastening holes 131 of the fixing frame 10 in a second direction D2, and connected to the display device 20 Therefore, the display devices 20 can be affixed to the fixed rods 13 of the fixing frame 10. In the embodiment, the first direction D1 may be perpendicular to the second direction D2, but it is not limited to thereto. In another embodiment, the second direction D2 is different the first direction D1.

The display devices 20 may be arranged on the fixing frame 10 in an array. The display apparatus 1 includes at least two display devices 20. For example, the number of display devices 20 may be 4, 6, 9, 12, or 16, but it is not limited to thereto. In the embodiment, the number of display devices 20 is 9.

Each of the display devices 20 is configured to an image. All the images displayed by the display devices 20 can be connected to an integrated image. Each of the display devices 20 may include a housing 21 and a display panel 22. The housing 21 and the display panel 22 may extend perpendicular to the second direction D2. The display panel 22 may be disposed on a side of the housing 21.

Figure 3:
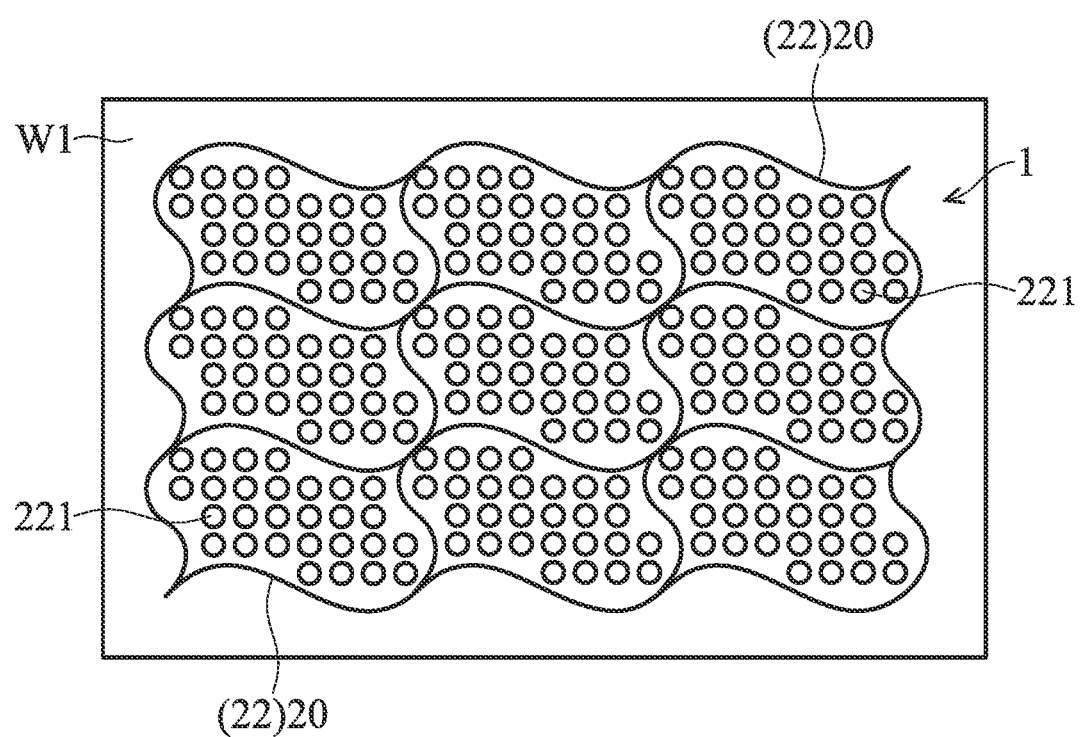
FIG. 3 is a schematic view of the display apparatus in accordance with the some embodiments of the present disclosure.

The size of the display panels 22 (or the display devices 20) may be substantially the same. In the embodiment, the display panels 22 (or the display devices 20) are rectangular. However, the size and the shape of the display panels 22 (or the display devices 20) of the present disclosure are not limited to be the same, as long as the display panels 22 (or the display devices 20) that can be combined, and the display signals of the display panels 22 (or the display devices 20) that are connected to each other. In other words, the sizes or the shapes of the display panels 22 (or the display devices 20) may be different. In some embodiments, the display panels 22 (or the display devices 20) may be in polygonal or irregular shape. The polygonal may be triangular, quadrilateral, pentagonal, or at least hexagonal. As shown in FIG. 3, the display panels 22 (or the display devices 20) are irregular, and connected to each other.

The display panel 22 may be a light-emitting-diode panel or a liquid-crystal panel. In the embodiment, the display panel 22 is a light-emitting-diode panel, and includes light-emitting diodes 221. The light-emitting diodes 221 may be arranged on the display panel 22 in an array. The light-emitting diodes 221 may be inorganic light-emitting diodes or organic light-emitting diodes. Each of the light-emitting diodes 221 are configured to emit light of a specific color, such a red light, yellow light or blue light. An image can be formed by the light emitted by each of the light-emitting diodes 221.

For the purpose of clarity, the size of the light-emitting diodes 221 is enlarged and the number of light-emitting diodes 221 is reduced in the figures of the present disclosure. For example, the number of light-emitting diodes 221 may be in a range from about one thousand to thirty million, but it is not limited to thereto.

Figure 4:
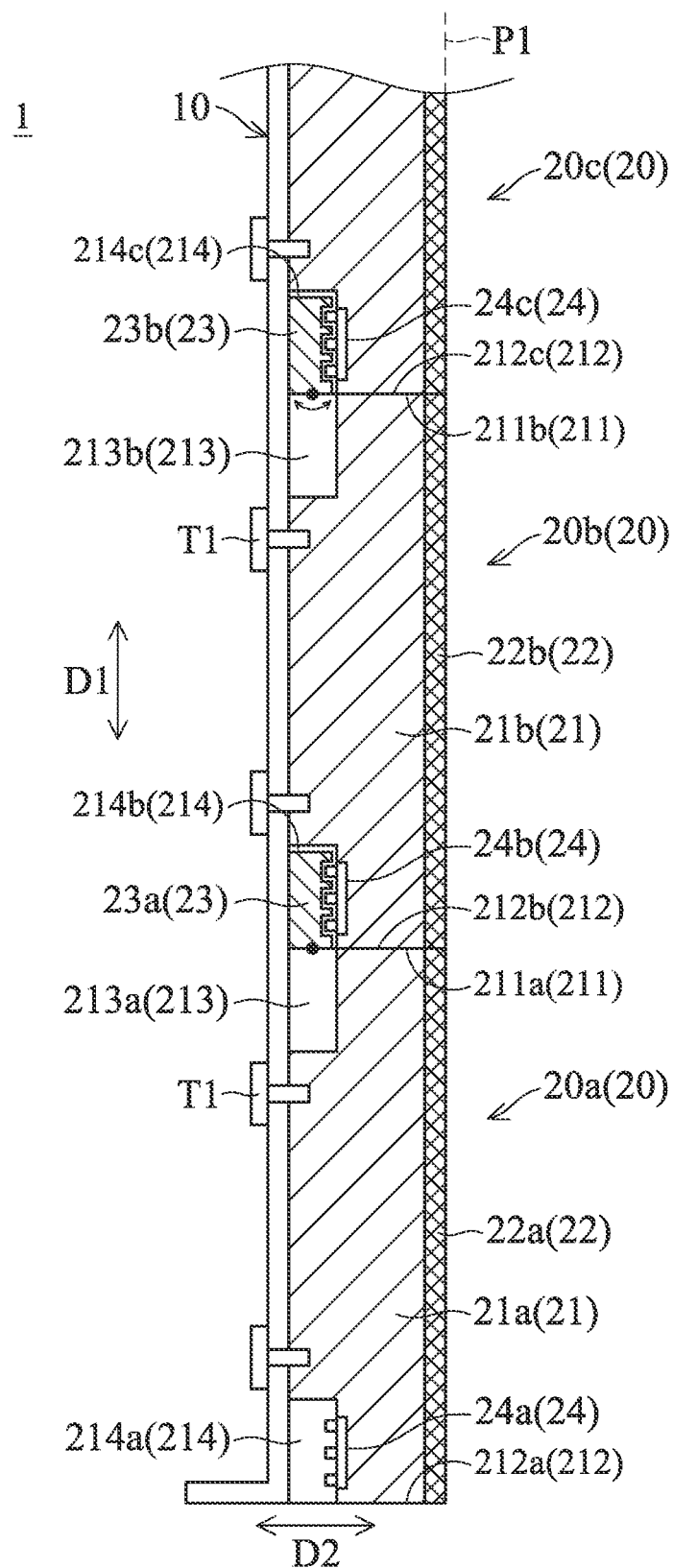
FIG. 4 is a schematic view of the display apparatus in accordance with the first embodiment of the present disclosure.

FIG. 4 is a schematic view of the display apparatus 1 in accordance with the first embodiment of the present disclosure. Each of the display devices 20 (20a, 20b and 20c) may further include an upper electrical connector 23 (23a, 23b, or 23c) and a lower electrical connector 24 (24a, 24b or 24c). The upper electrical connectors 23 are located at the top portions 211 (211a, 211b and 211c) of the housings 21, and the lower electrical connectors 24 are located at the bottom portions 212 (212a, 212b and 212c) of the housings 21. Moreover, the lower electrical connectors 24 are electrically connected to the upper electrical connectors 23.

Each housing 21 may have upper receiving grooves 213 (213a or 213b) and lower receiving grooves 214 (214a, 214b or 214c). The upper receiving grooves 213 are located at the top portion 211 (211a, 211b or 211c) of the housing 21, and the lower receiving grooves 214 are located at the bottom portion 212 (212a, 212b or 212c) of the housing 21. In the embodiment, the upper receiving grooves 213 are exposed from the rear side 216 (216a, 216b or 216c) of the housing 21. The upper electrical connectors 23 are connected to or pivoted on the top portion 211 of the housing 21, and the lower electrical connectors 24 may be located in the lower receiving grooves 214.

In the embodiment, the upper electrical connector 23 may be rotated relative to the housing 21. When the upper electrical connector 23 is located in the storage position, the upper electrical connector 23 is located in the upper receiving groove 213, and the upper electrical connector 23 may not protrude over the top portion 211 of the housing 21. When the upper electrical connector 23 is located in the connection position, the upper electrical connector 23 is movable and protrudes over the first top portion 211, and one end of the upper electrical connector 23 is not located in the upper receiving groove 213.

As shown in FIG. 2 and FIG. 4, during assembly of the display apparatus 1, the display device (first display device) 20a may be affixed to the fixing frame 10 by the fixing element T1. Moreover, the upper electrical connector 23a of the display device 20a is rotated into the connection position.

The display device (second display device) 20b may be disposed on the display device 20a. In other words, the bottom portion 212b of the display device 20b corresponds to or is aligned with the top portion 211a of the display device 20a. Afterwards, the upper electrical connector 23a of the display device 20a corresponds to (or is aligned with) and is connected to the lower electrical connector 24b of the display device 20b. In another embodiment, the upper electrical connector 23a is electrically connected to the lower electrical connector 24b. In another embodiment, the upper electrical connector 23a is adjacent to the lower electrical connector 24b. At least a portion of the upper electrical connector 23a overlaps the lower electrical connector 24b in the first direction D1 or the second direction D2.

In the embodiment, the upper electrical connector 23a of the display device 20a is located in the lower receiving groove 214b of the display device 20b, and the upper electrical connector 23a is connected to the lower electrical connector 24b in the lower receiving groove 214b. In other words, when the upper electrical connector 23a is connected to the lower electrical connector 24b, the upper electrical connector 23a is located in the lower receiving groove 214b. Finally, the display device 20b is affixed to the fixing frame 10 by the fixing element T1, and thus the assembly of the display device 20b may be easily completed.

The display device (third display device) 20c may be disposed on the display device 20b. In other words, the bottom portion 212c of the display device 20c corresponds to or is aligned with the top portion 211b of the display device 20b. Afterwards, the upper electrical connector 23b of the display device 20b is moved to the connection position, and the upper electrical connector 23b corresponds to and is connected to the lower electrical connector 24c of the display device 20c. In another embodiment, the upper electrical connector 23b is electrically connected to the lower electrical connector 24c. In another embodiment, the upper electrical connector 23b is adjacent to the lower electrical connector 24c and at least a portion of the upper electrical connector 23b overlaps the lower electrical connector 24c in the first direction D1 or the second direction D2.

In the embodiment, the upper electrical connector 23b is located in the lower receiving groove 214c of the display device 20c, and the upper electrical connector 23b is connected to the lower electrical connector 24c in the lower receiving groove 214c. In other words, when the upper electrical connector 23b is connected to the lower electrical connector 24c, the upper electrical connector 23b is located in the lower receiving groove 214c. Finally, the display device 20c may be affixed to the fixing frame 10 by the fixing element T1, and thus the assembly of the display device 20c may be easily completed. Moreover, as shown in FIG. 2, the upper electrical connector 23c of the display device 20c is located in the storage position.

In the embodiment, the shape of the lower receiving groove 214 may correspond to the shape of the upper electrical connector 23. When the display device 20b is assembled on the display device 20a, the upper electrical connector 23a is inserted into the lower receiving groove 214b of the display device 20b. Thus, the relative position between the display device 20b and the display device 20a may be limited by the upper electrical connector 23a and the lower receiving groove 214b of the display device 20b, thereby assisting the alignment and assembly between the display devices 20.

Moreover, when the display device 20c is assembled on the display device 20b, the upper electrical connector 23b is inserted in the display device 20c of the lower receiving groove 214c. Therefore, the relative position between the display device 20c and the display device 20b may be limited by the upper electrical connector 23b and the lower receiving groove 214c of the display device 20c, thereby assisting the alignment and assembly between the display devices 20.

In the embodiment, the alignment between the display devices 20 can be easily performed by the upper electrical connector 23 and the lower receiving groove 214, so as to place the display panels 22 on a reference plane P1. Therefore, the assembly time of the display apparatus 1 may be reduced, and the integrated image displayed by the display apparatus 1 may be improved.

As shown in FIG. 4, the display device 20a, the display device 20b, and the display device 20c are arranged in a first direction D1. The lower electrical connector 24a of the display device 20a is electrically connected to the upper electrical connector 23a, and the upper electrical connector 23a is electrically connected to the lower electrical connector 24b of the display device 20b. The lower electrical connector 24b of the display device 20b is electrically connected to the upper electrical connector 23b, and the upper electrical connector 23b is electrically connected to the lower electrical connector 24c of the display device 20c.

In the embodiment, a signal source and a power (not shown in figures) may be electrically connected to the lower electrical connector 24a of the display device 20a. Therefore, the image signal generated by the signal source may be transmitted to the display device 20a via the lower electrical connector 24a, to the display device 20b via the lower electrical connector 24b, and to the display device 20c via the lower electrical connector 24c. The current generated by the power may be transmitted to the display device 20a via the lower electrical connector 24a, to the display device 20b via the lower electrical connector 24b, and to the display device 20c via the lower electrical connector 24c.

Accordingly, when the display device 20 is mounted on the fixing frame 10, additional connection lines may not be required to be connected to each display device 20, thereby reducing the complexity of assembling the display apparatus 1.

Figure 5:
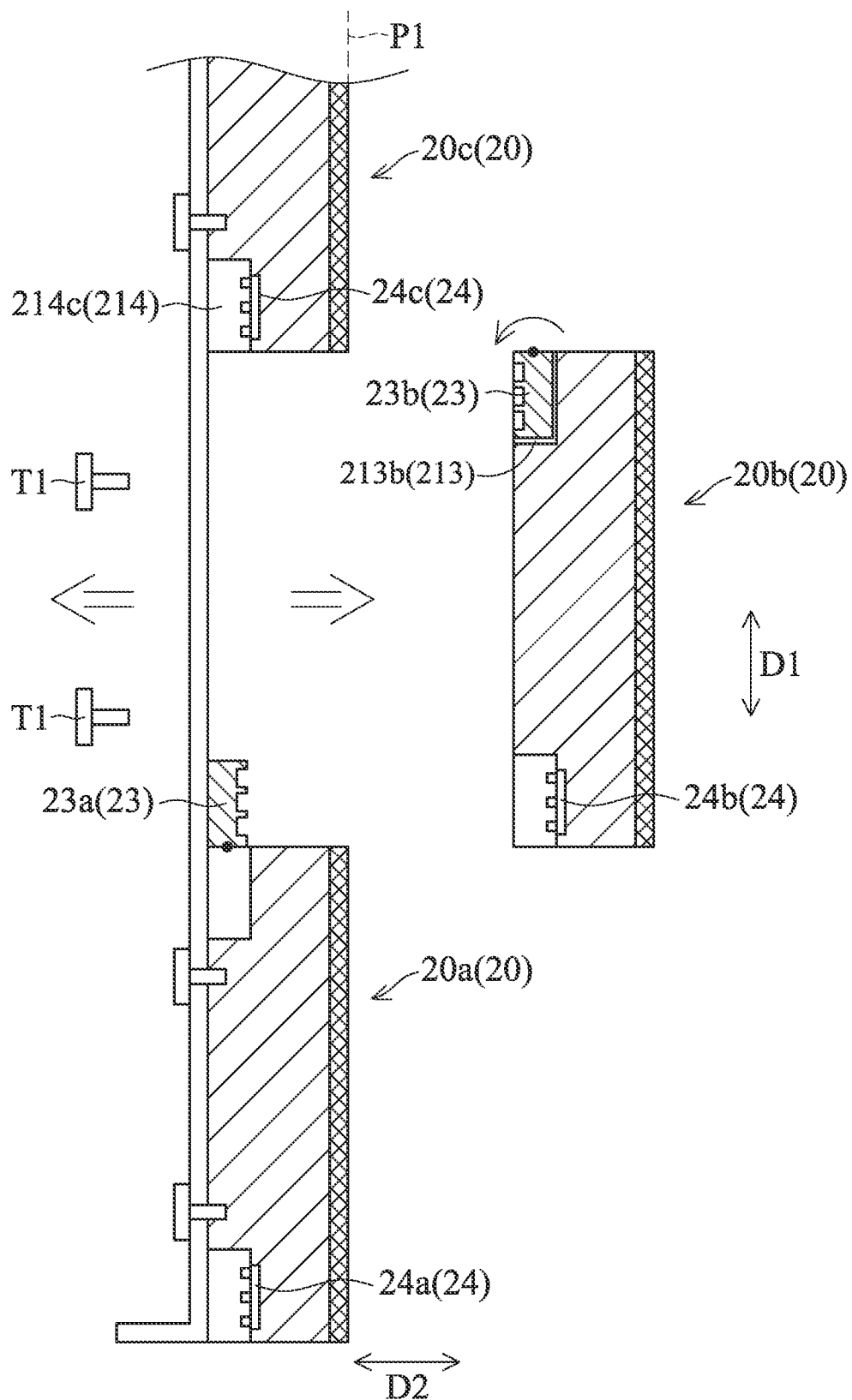
FIG. 5 is a schematic view of the display apparatus in accordance with the first embodiment of the present disclosure.

FIG. 5 is a schematic view of the display apparatus 1 in accordance with the first embodiment of the present disclosure. In the embodiment, when one of the display devices 20 is damaged, the damaged display device 20 may be directly removed in the second direction D2 without removing the adjacent display device 20. Therefore, the efficiency of repairing the display apparatus 1 is improved, and the difficulty of repairing the display apparatus 1 is reduced.

As shown in FIG. 5, when the display device 20b is damaged and needs to be repaired, the fixing element T1 may be removed from the display device 20b. Moreover, the upper electrical connector 23b may be removed from the lower receiving groove 214c of the display device 20c, and is moved to the storage position in the upper receiving groove 213b of the display device 20b. Afterwards, the display device 20b can be moved and separated from the fixing frame 10, the display device 20a and the display device 20c in the second direction D2. Therefore, when the display device 20b is damaged and needs to be repaired, it is not necessary to remove the display device 20a and/or the display device 20c, thereby improving the efficiency of repairing the display apparatus 1 and reducing the difficulty of repairing the display apparatus 1.

Figure 6:
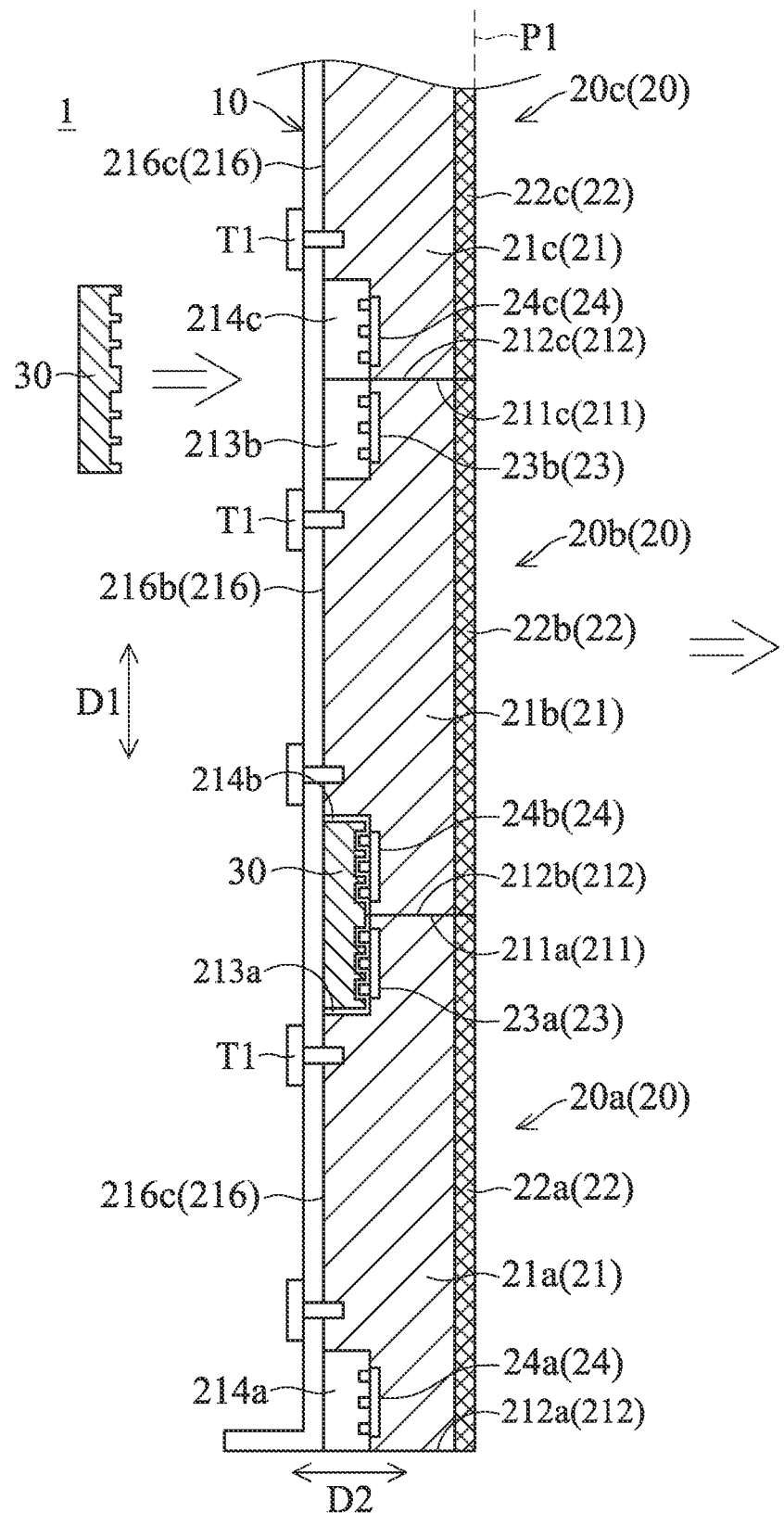
FIG. 6 is a schematic view of the display apparatus in accordance with the second embodiment of the present disclosure.

FIG. 6 is a schematic view of the display apparatus 1 in accordance with the second embodiment of the present disclosure. In the embodiment, the upper electrical connector 23 is located in the upper receiving groove 213. The display apparatus 1 further includes connection elements 30 that are detachably connected to the upper electrical connector 23 and the lower electrical connector 24 of two adjacent display devices 20.

As shown in FIG. 6, during assembly of the display apparatus 1, the display device 20a may be affixed to the fixing frame 10 by the fixing element T1. Afterwards, the display device 20b may be placed on the display device 20a, and the lower receiving groove 214b of the display device 20b is aligned with the upper receiving groove 213a of the display device 20a. In other words, the lower receiving groove 214b of the display device 20b is connected to the upper receiving groove 213a of the display device 20a in the first direction D1.

Afterwards, the connection element 30 is inserted into the lower receiving groove 214b of the display device 20b and the upper receiving groove 213a of the display device 20a, and connected to the upper electrical connector 23a and the lower electrical connector 24b. Therefore, the upper electrical connector 23a is electrically connected to the lower electrical connector 24b via the connection element 30. Finally, the display device 20b is affixed to the fixing frame 10 by the fixing element T1, and thus the assembly of the display device 20b may be completed.

The display device 20c is placed on the display device 20b, and the lower receiving groove 214c of the display device 20c is aligned with the upper receiving groove 213b of the display device 20b. Afterwards, the connection element 30 is inserted into the lower receiving groove 214c of the display device 20c and the upper receiving groove 213b of the display device 20b, and connected to the upper electrical connector 23b and the lower electrical connector 24c. Therefore, the upper electrical connector 23b is electrically connected to the lower electrical connector 24c via the connection element 30. Finally, the display device 20c is affixed to the fixing frame 10 by the fixing element T1, and thus the assembly of the display device 20c may be completed.

In the embodiment, the alignment between the display devices 20 can be easily performed by the connection element 30, the upper receiving groove 213 and the lower receiving groove 214, so as to place the display panels 22 on a reference plane P1. Therefore, the assembly time of the display apparatus 1 may be reduced, and the integrated image displayed by the display apparatus 1 may be improved.

As shown in FIG. 6, when the display device 20b is damaged and needs to be repaired, the fixing element T1 may be removed from the display device 20b, and the connection elements 30 in the upper receiving groove 213b and the and the lower receiving groove 214b of the display device 20b are separated from the display device 20b. Afterwards, the display device 20b may be moved in the second direction D2, and removed from the fixing frame 10, the display device 20a and the display device 20c. Therefore, when the display device 20b is damaged and needs to be repaired, it is not necessary to remove the display device 20a and/or the display device 20c, thereby improving the efficiency of repairing the display apparatus 1 and reducing the difficulty of repairing the display apparatus 1.

Figure 7:
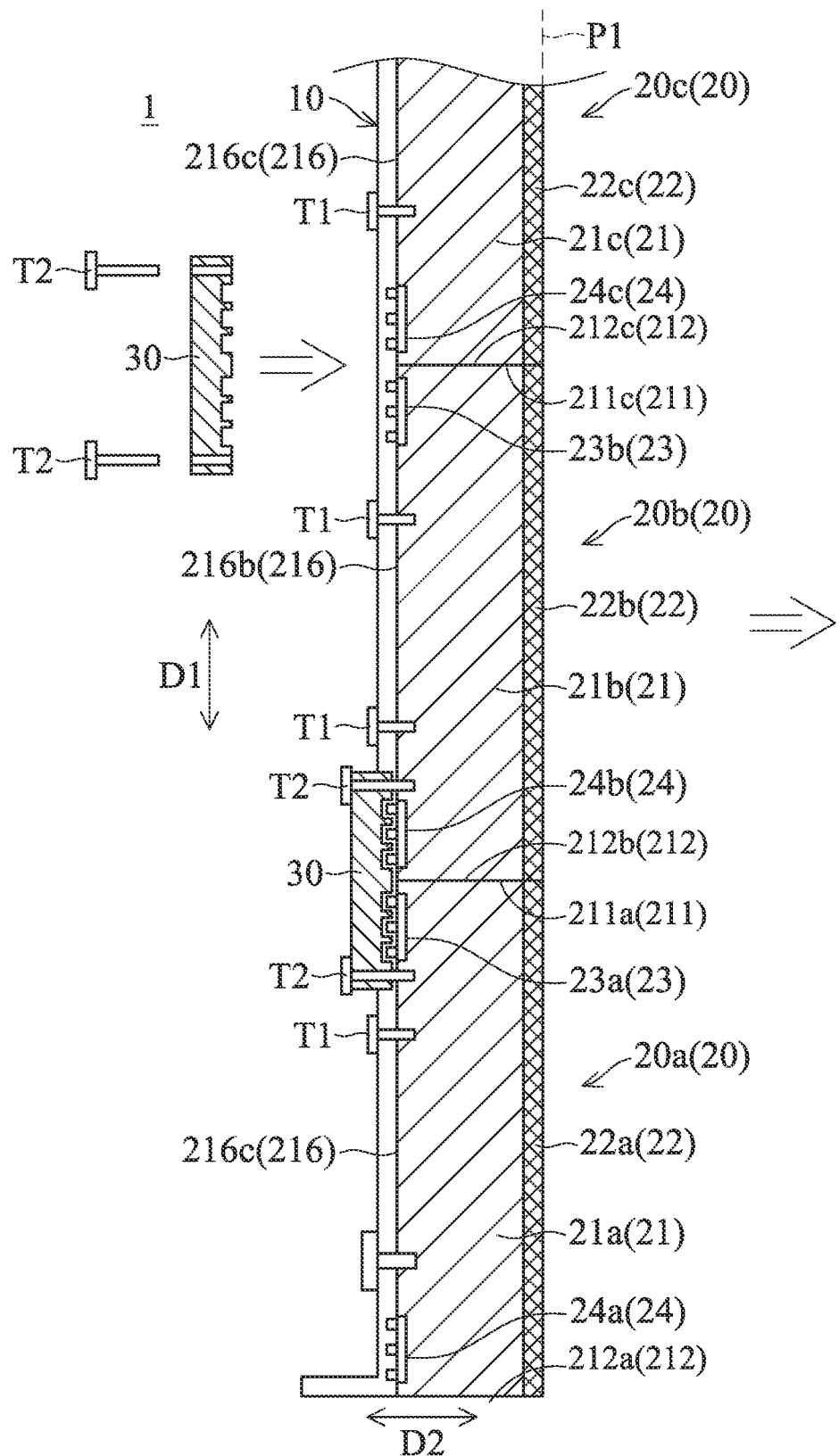
FIG. 7 is a schematic view of the display apparatus in accordance with the third embodiment of the present disclosure.

FIG. 7 is a schematic view of the display apparatus 1 in accordance with the third embodiment of the present disclosure. In the embodiment, the display device 20 may not include the upper receiving groove 213 and the lower receiving groove 214. The upper electrical connector 23 and the lower electrical connector 24 are disposed on the rear side 216 of the housing 21. The connection element 30 is detachably connected to the upper electrical connector 23 and the lower electrical connector 24 of two adjacent display devices 20. In the embodiment, the connection element 30 may be affixed to the rear side 216 of the housing 21 by the fixing element (second fixing element) T2.

As shown in FIG. 7, during assembly of the display apparatus 1, the display device 20a may be affixed to the fixing frame 10 by the fixing element T1. Afterwards, the display device 20b may be placed on the display device 20a, and the display device 20b is aligned with the display device 20a. Afterwards, the connection element 30 is connected to the upper electrical connector 23a and the lower electrical connector 24b. Moreover, the connection element 30 may be affix to the display device 20a and the display device 20b by fixing elements (second fixing elements) T2. Finally, the display device 20b may be affixed to the fixing frame 10 by the fixing element T1, and thus the assembly of the display device 20b may be completed.

The display device 20c is placed on the display device 20b, and the display device 20c is aligned with the display device 20b. Afterwards, the connection element 30 is connected to the upper electrical connector 23b and the lower electrical connector 24c. Moreover, the connection element 30 may be affixed to the display device 20b and the display device 20c by the fixing elements (second fixing elements) T2. Finally, the display device 20c is affixed to the fixing frame 10 by the fixing element T1, and thus the assembly of the display device 20c may be completed.

During assembly of the connection element 30, the alignment between the display devices 20 can be easily performed by the connection element 30, the upper electrical connector 23 and the lower electrical connector 24, so as to place the display panels 22 on a reference plane P1. Therefore, the assembly time of the display apparatus 1 may be reduced, and the integrated image displayed by the display apparatus 1 may be improved.

Figure 8:
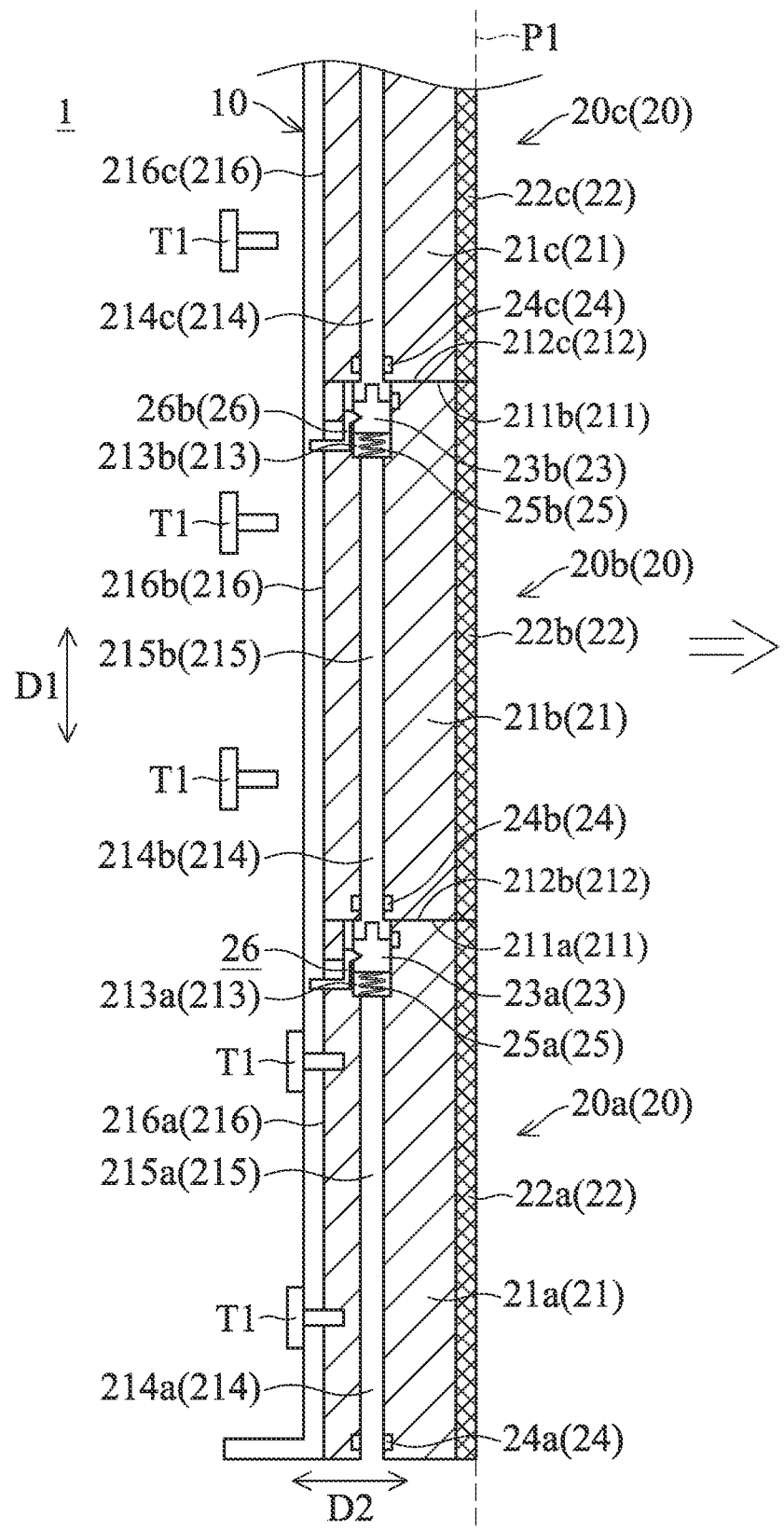
FIG. 8 is a schematic view of the display apparatus in accordance with the fourth embodiment of the present disclosure, wherein the upper electrical connector is located in the storage position.
Figure 9:
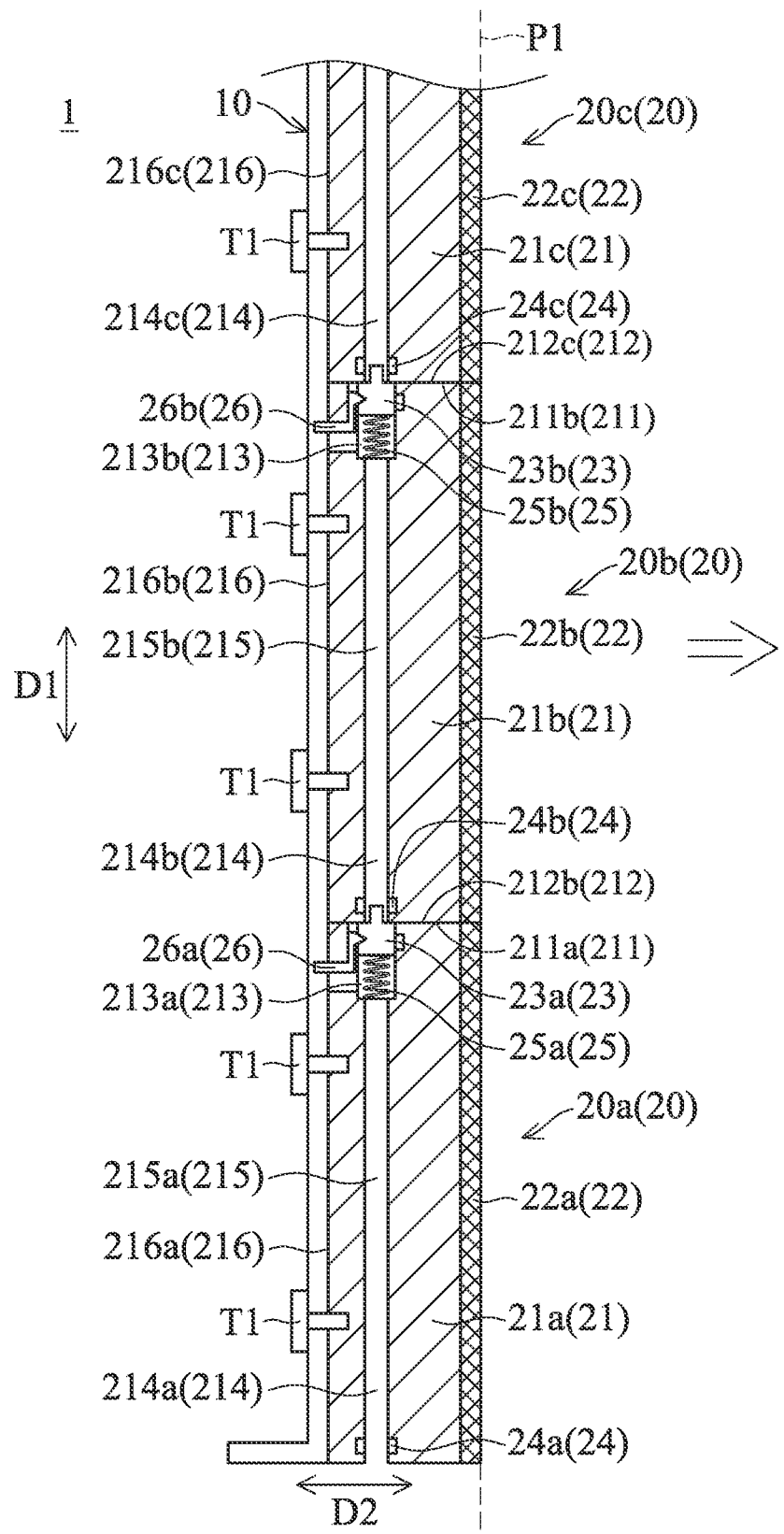
FIG. 9 is a schematic view of the display apparatus in accordance with the fourth embodiment of the present disclosure, wherein the upper electrical connector is located in the connection position.

FIG. 8 is a schematic view of the display apparatus 1 in accordance with the fourth embodiment of the present disclosure, wherein the upper electrical connector 23 is located in the storage position. FIG. 9 is a schematic view of the display apparatus 1 in accordance with the fourth embodiment of the present disclosure, wherein the upper electrical connector 23 is located in the connection position.

In the embodiment, the upper receiving groove 213 (213a or 213b) is in communication with the lower receiving groove 214 (214a, 214b or 214c) via a channel 215 (215a or 215b). In other words, the upper receiving groove 123, and the lower receiving groove 214 and the channel 215 are intergraded. Therefore, cables can be disposed in the upper receiving groove 213, the lower receiving groove 214 and the channel 215 of the display device 20, and the display device 20 may utilize the channel 215 for heat dissipation.

The upper electrical connector 23 may be movably disposed in the upper receiving groove 213, and the lower electrical connector 24 is located in the lower receiving groove 214. As shown in FIG. 8, when the upper electrical connector 23 is located in the storage position, the upper electrical connector 23 is located in the upper receiving groove 213, and may not protrude over the top portion 211 of the display device 20. As shown in FIG. 9, when the upper electrical connector 23 is located in the connection position, the upper electrical connector 23 may be moved to protrude over the top portion 211.

Each of the display devices 20 includes an elastic element 25 and a movement element 26. The elastic element 25 is disposed in the upper receiving groove 213, and provides an elastic force for pushing the upper electrical connector 23. In some embodiments, the elastic element 25 may be a spring.

One end of the elastic element 25 is in contact with the housing 21, and the other end of the elastic element 25 is in contact with the upper electrical connector 23.

The movement element 26 may be disposed on the housing 21. The movement element 26 may be connected to the upper electrical connector 23, and protrude over the rear side 216 of the housing 21. Therefore, the user may move the movement element 26 from the rear side 216 of the housing 21 so as to selectively move the upper electrical connector 23 to the storage position and the connection position.

In the embodiment, the user may push the movement element 26 to move so as to move the movement element 26 to the storage position. When the upper electrical connector 23 is located in the storage position, the elastic element 25 provides an elastic force for moving the upper electrical connector 23 into the connection position.

As shown in FIG. 8, during assembly of the display apparatus 1, the display device 20a may be affixed to the fixing frame 10 by the fixing element T1. Afterwards, the upper electrical connector 23a of the display device 20a is moved to the storage position, and the display device 20b is placed on the display device 20a. Afterwards, as shown in FIG. 9, the upper electrical connector 23a is moved to the connection position. Moreover, the upper electrical connector 23a is inserted into the lower receiving groove 214 of the display device 20b, and connected to the lower electrical connector 24b of the display device 20b. Finally, the display device 20b is affixed to the fixing frame 10 by the fixing element T1, and thus the assembly of the display device 20b may be completed.

The upper electrical connector 23b of the display device 20b is moved to the storage position, and the display device 20c is placed on the display device 20b. Afterwards, as shown in FIG. 9, the upper electrical connector 23b is moved to the connection position. The upper electrical connector 23b is inserted into the lower receiving groove 214c of the display device 20c, and connected to the lower electrical connector 24c of the display device 20c. Finally, the display device 20c is affixed to the fixing frame 10 by the fixing element T1, and thus the assembly of the display device 20c may be completed.

In the embodiment, the alignment between the display devices 20 can be easily performed by the upper electrical connector 23 and the lower receiving groove 214, so as to place the display panels 22 on a reference plane P1. Therefore, the assembly time of the display apparatus 1 may be reduced, and the integrated image displayed by the display apparatus 1 may be improved.

As shown in FIG. 8, when the display device 20b is damaged and needs to be repaired, the fixing element T1 may be removed from the display device 20b, and the upper electrical connector 23a of the display device 20a and the upper electrical connector 23b of the display device 20b are moved to the storage position. Afterwards, the display device 20b may be moved in the second direction D2, and removed from the fixing frame 10, the display device 20a and the display device 20c. Therefore, when the display device 20b is damaged and needs to be repaired, it is not necessary to remove the display device 20a and/or the display device 20c, thereby improving the efficiency of repairing the display apparatus 1 and reducing the difficulty of repairing the display apparatus 1.

Figure 10:
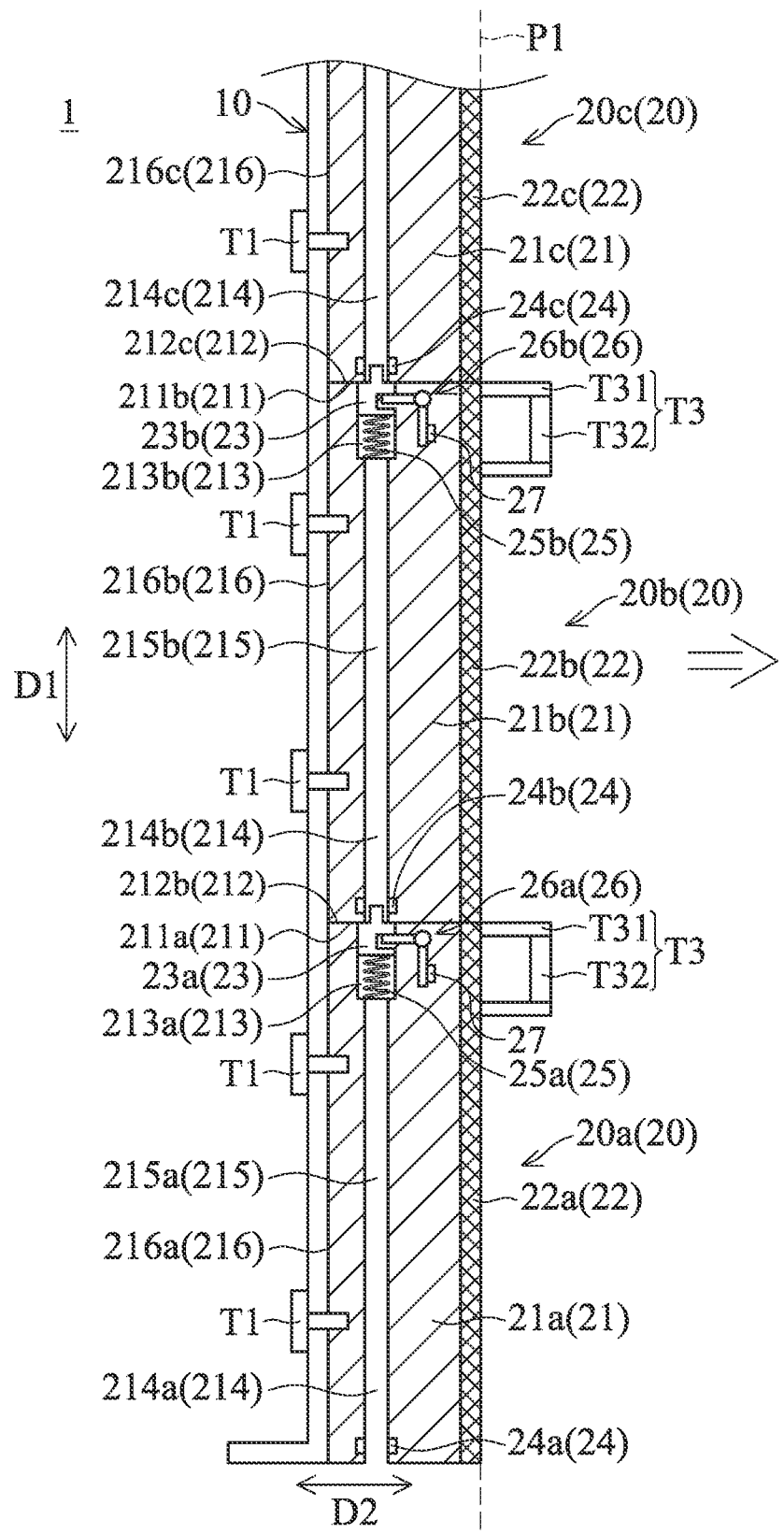
FIG. 10 is a schematic view of the display apparatus in accordance with the fifth embodiment of the present disclosure, wherein the upper electrical connector is located in the connection position.
Figure 11:
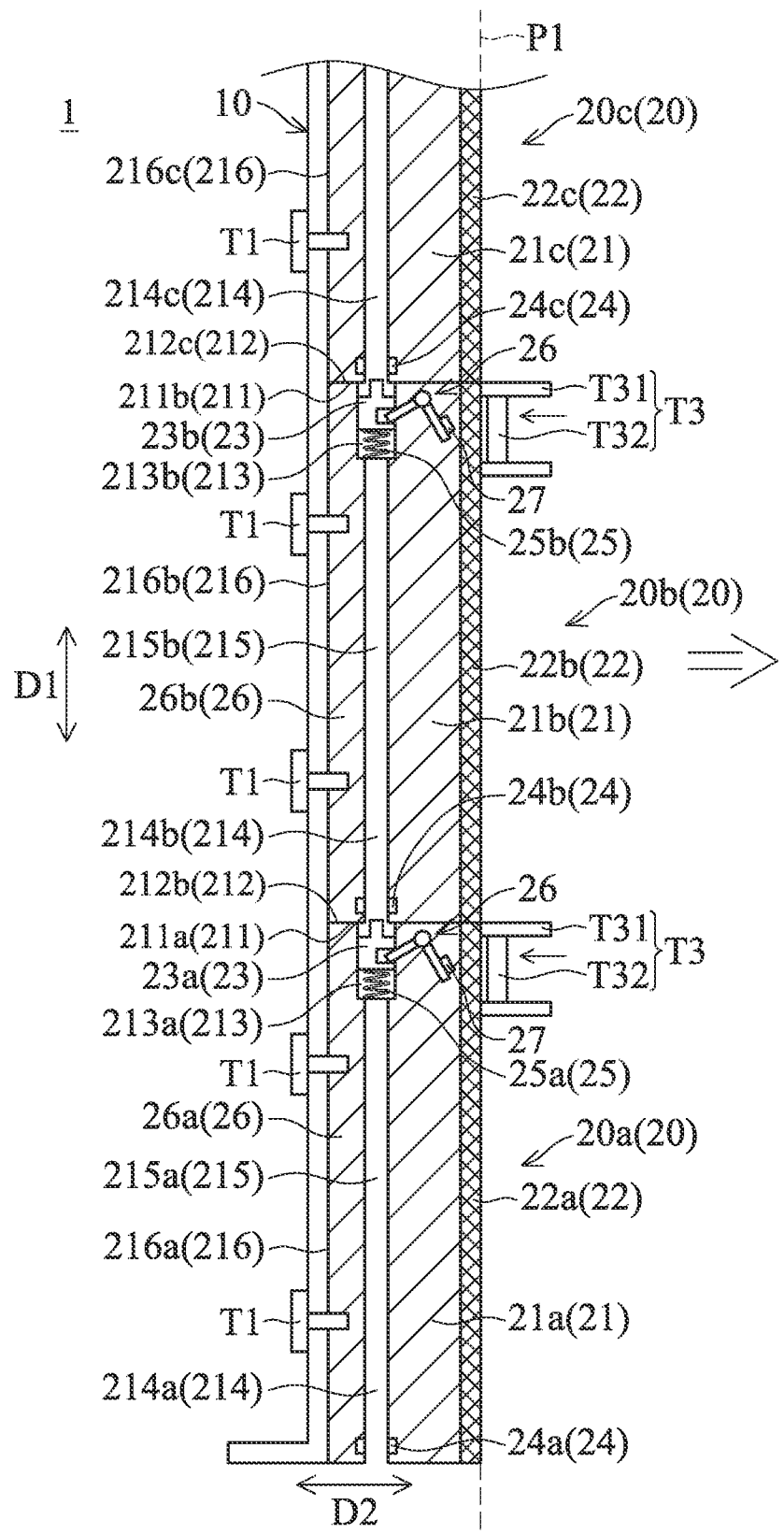
FIG. 11 is a schematic view of the display apparatus in accordance with the fifth embodiment of the present disclosure, wherein the upper electrical connector is located in the storage position.

FIG. 10 is a schematic view of the display apparatus 1 in accordance with the fifth embodiment of the present disclosure, wherein the upper electrical connector 23 is located in the connection position. FIG. 11 is a schematic view of the display apparatus 1 in accordance with the fifth embodiment of the present disclosure, wherein the upper electrical connector 23 is located in the storage position. The fifth embodiment is different from the fourth embodiment in that the movement element 26 is connected (or pivoted) within the housing 21. The display device 20 further includes a first magnetic element 27 disposed on the movement element 26.

In the embodiment, the movement element 26 may be an L-shaped structure. One end of the movement element 26 is connected to the upper electrical connector 23, and the first magnetic element 27 is disposed on the other end of the movement element 26.

In the embodiment, the upper electrical connector 23 may be moved from the connection position in FIG. 10 to the storage position in FIG. 11 by at least one magnetic device T3. The magnetic device T3 is configured to generate a magnetic force to the first magnetic element 27. When the first magnetic element 27 is moved toward the display panel 22 by the attraction of the magnetic force generated by the magnetic device T3, the movement element 26 is rotate to move the upper electrical connector 23 to the storage position.

In the embodiment, the magnetic device T3 may include a mounting frame T31 and a second magnetic element T32. The mounting frame T31 may be detachably disposed on the display device 20, and in contact with or adjacent to the display panel 22. The second magnetic element T32 may be movably disposed on the mounting frame T31, and may be located in the mounting frame T31.

When the upper electrical connector 23 is to be moved from the connection position to the storage position, as shown in FIG. 10, the magnetic device T3 can be mounted on the display device 20, and in contact with or adjacent to the display panel 22. Moreover, the second magnetic element T32 is located in the first position far from the display panel 22. When the second magnetic element T32 is far from the display panel 22, the magnetic force generated by the second magnetic element T32 to the first magnetic element 27 is less than the elastic force applied by the elastic element 25 to the upper electrical connector 23. Therefore, the upper electrical connector 23 is maintained at the connection position.

As shown in FIG. 11, when the second magnetic element T32 is moved to a second position that is adjacent to the display panel 22, the magnetic force generated by the second magnetic element T32 to the first magnetic element 27 is greater than the elastic force applied by the elastic element 25 to the upper electrical connector 23. Therefore, the movement element 26 may move the upper electrical connector 23 to the storage position.

As shown in FIG. 11, when the upper electrical connectors 23a and 23b is moved to the storage position, the fixing element T1 may be removed from the display device 20b, the display device 20b may be moved in the second direction D2 and removed from the fixing frame 10, the display device 20a and the display device 20c. Therefore, when the display device 20b is damaged and needs to be repaired, it is not necessary to remove the display device 20a and/or the display device 20c, thereby improving the efficiency of repairing the display apparatus 1 and reducing the difficulty of repairing the display apparatus 1.

Figure 12:
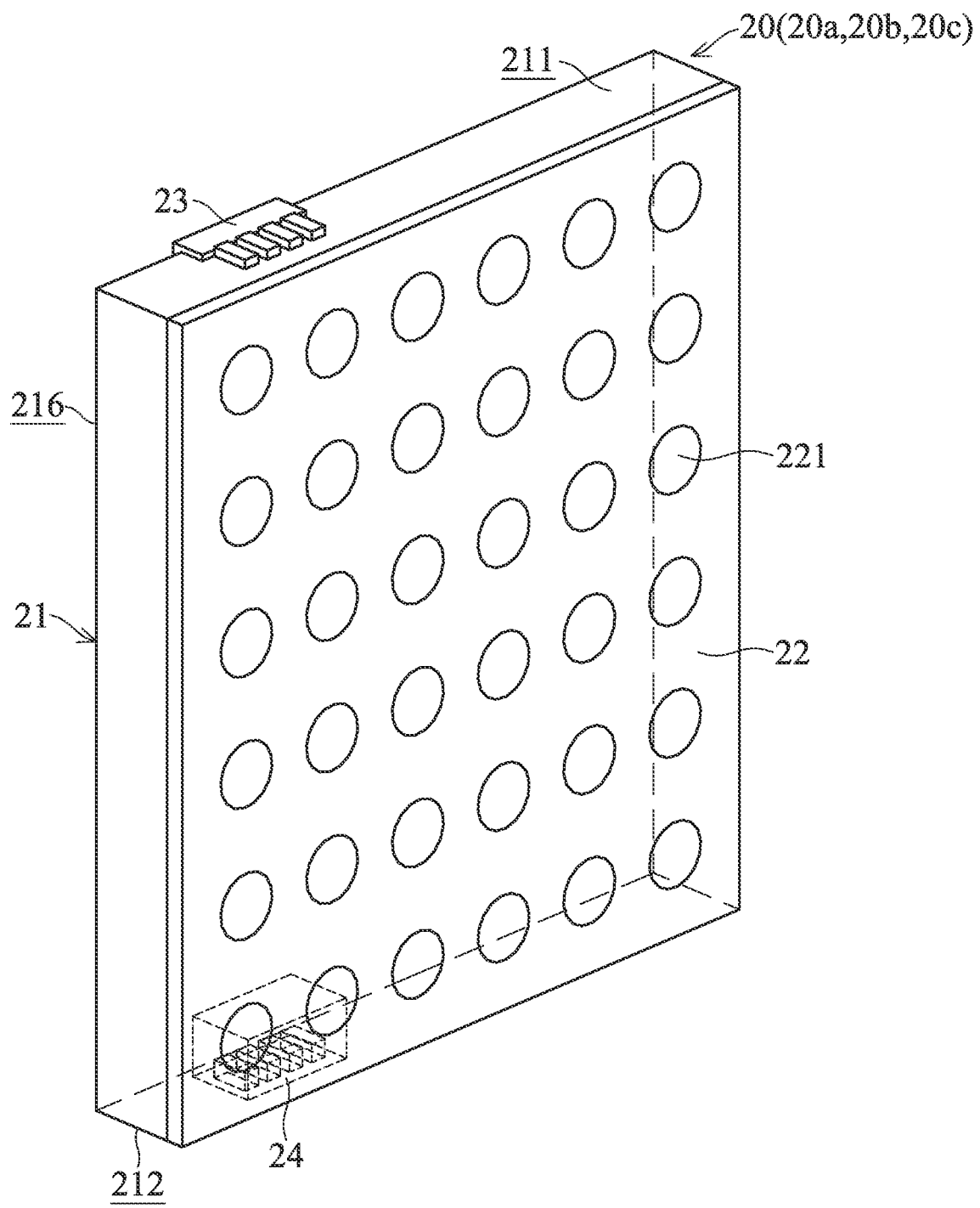
FIG. 12 is a perspective view of the display device in accordance with the sixth embodiment of the present disclosure.
Figure 13:
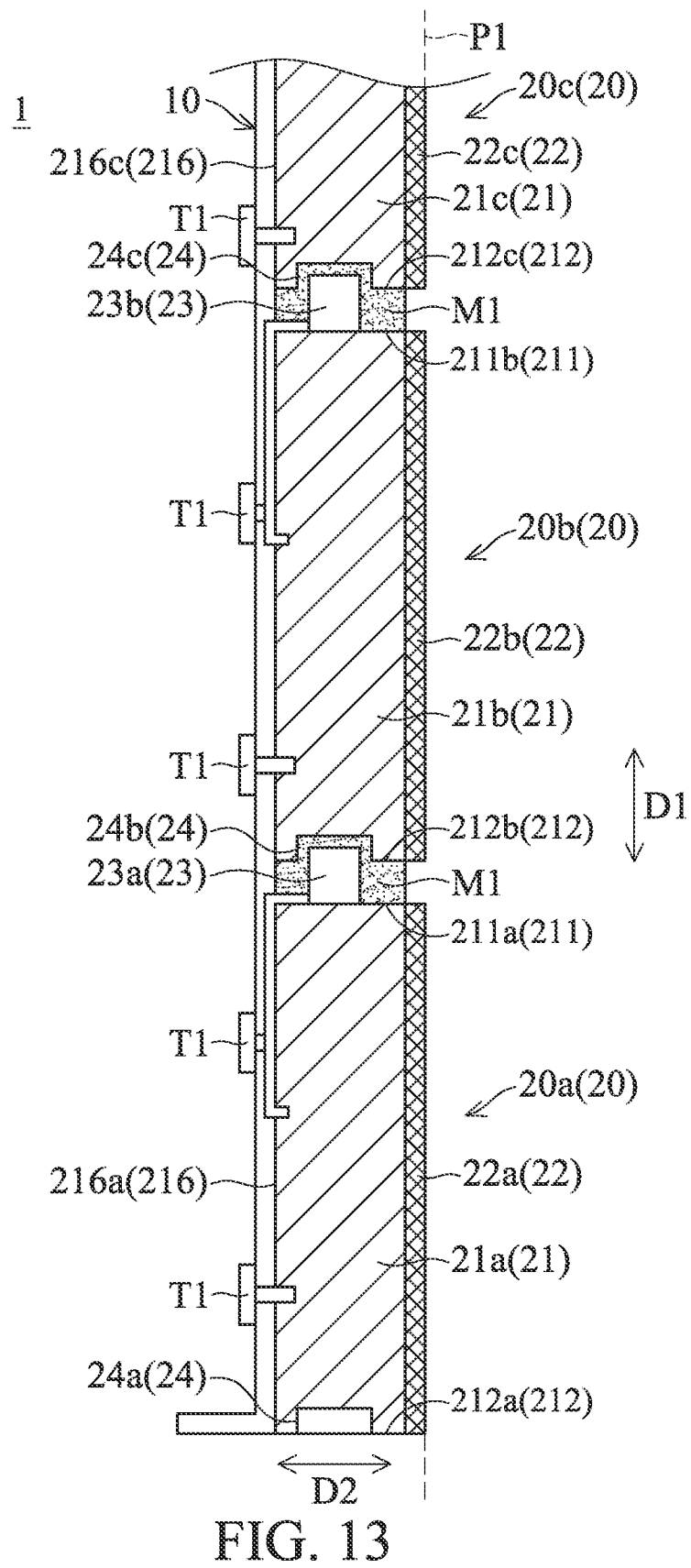
FIG. 13 is a schematic view of the display apparatus in accordance with the sixth embodiment of the present disclosure.

FIG. 12 is a perspective view of the display device 20 in accordance with the sixth embodiment of the present disclosure. FIG. 13 is a schematic view of the display apparatus 1 in accordance with the sixth embodiment of the present disclosure. In the embodiment, the upper electrical connector 23 and the lower electrical connector 24 may be cables. One end of the upper electrical connector 23 is connected to the top portion 211 of the housing 21, and the other end of the upper electrical connector 23 is connected to the rear side 216 of the housing 21. The lower electrical connector 24 is disposed on the bottom portion 212 of the housing 21.

In the embodiment, the upper electrical connector 23 may protrude over the top portion 211 of the housing 21, and the lower electrical connector 24 is located in the bottom portion 212 of the housing 21. When two display devices 20 are connected, the upper electrical connector 23 and the lower electrical connector 24 may have a function of alignment for aligning the two display devices 20.

As shown in FIG. 12 and FIG. 13, during assembly of the display apparatus 1, the display device 20a may be affixed to the fixing frame 10 by the fixing element T1. Afterwards, a conductive glue M1 may be coated on the top portion 211a of the display device 20a. The display device 20b may be placed on the display device 20a, and the lower electrical connector 24b of the display device 20b is aligned with the upper electrical connector 23a of the display device 20a. The present disclosure does not particularly limit the coating position of the conductive glue M1, as long as the conductive glue M1 is disposed between the two display devices 20. In other words, in another embodiment, the conductive glue M1 may be coated on the bottom portion 212b of the display device 20b, and then the display device 20b is placed on the display device 20a.

After the lower electrical connector 24b of the display device 20b is aligned with the upper electrical connector 23a of the display device 20a, the display device 20b can be easily aligned with the display device 20a, and the lower electrical connector 24b of the display device 20b can correspond to or be connected to the upper electrical connector 23a of the display device 20a. In another embodiment, upper electrical connector 23a is electrically connected to the lower electrical connector 24b. In another embodiment, the upper electrical connector 23a is adjacent to the lower electrical connector 24b. At least a portion of the upper electrical connector 23a overlaps the lower electrical connector 24b in the first direction D1 or the second direction D2. Finally, the display device 20b is affixed to the fixing frame 10 by the fixing element T1, and thus the assembly of the display device 20b may be easily completed.

Afterwards, the conductive glue M1 may be coated on the top portion 211b of the display device 20b. The display device 20c is placed on the display device 20b, and the lower electrical connector 24c of the display device 20c is aligned with the upper electrical connector 23b of the display device 20b. The present disclosure does not particularly limit the coating position of the conductive glue M1, as long as the conductive glue M1 is disposed between the two display devices 20. In other words, in another embodiment, the conductive glue M1 may be coated on the bottom portion 212c of the display device 20c, and then the display device 20c is placed on the display device 20a.

After the lower electrical connector 24c of the display device 20c is aligned with the upper electrical connector 23b of the display device 20b, the display device 20c can be easily aligned with the display device 20b, and the lower electrical connector 24c of the display device 20c can correspond to or be connected to the upper electrical connector 23b of the display device 20b. In another embodiment, upper electrical connector 23b is electrically connected to the lower electrical connector 24c. In another embodiment, the upper electrical connector 23b is adjacent to the lower electrical connector 24c. At least a portion of the upper electrical connector 23b overlaps the lower electrical connector 24c in the first direction D1 or the second direction D2. Finally, the display device 20c is affixed to the fixing frame 10 by the fixing element T1, and thus the assembly of the display device 20c may be easily completed.

In the embodiment, the conductive glue M1 may be anisotropic conductive film (ACF). The upper electrical connector 23 and the lower electrical connector 24 of two adjacent display devices 20 can be finely electrically connected to each other in the first direction D1 by the conductive glue M1.

In the embodiment, the alignment between the display devices 20 can be easily performed by the upper electrical connector 23 and the lower electrical connector 24, so as to place the display panels 22 on a reference plane P1. Therefore, the assembly time of the display apparatus 1 may be reduced, and the integrated image displayed by the display apparatus 1 may be improved.

As shown in FIG. 13, when the display device 20b is damaged and needs to be repaired, the fixing element T1 may be removed from the display device 20b. Moreover, the display device 20b can be moved and separated from the fixing frame 10, the display device 20a and the display device 20c in the second direction D2 by applying force or using the appropriate tool (such as a cutting knife). Therefore, when the display device 20b is damaged and needs to be repaired, it is not necessary to remove the display device 20a and/or the display device 20c, thereby improving the efficiency of repairing the display apparatus 1 and reducing the difficulty of repairing the display apparatus 1.

In the embodiment, damage to the upper electrical connector 23 and/or the lower electrical connector 24 may occur during the removal of the display device 20b. However, since the upper electrical connector 23 and/or the lower electrical connector 24 are attached to the outside of the housing 21, the replacement of the upper electrical connector 23 and/or the lower electrical connector 24 can be easily performed.

The disclosed features may be combined, modified, or replaced in any suitable manner in one or more disclosed embodiments, but are not limited to any particular embodiments.

In conclusion, during assembly of the display devices, the display apparatus of the present disclosure may not need additional connection lines to connect to the display devices 20, thereby reducing the complexity of assembling the display apparatus 1. Moreover, the display apparatus utilizes the limit mechanisms (such as the lower receiving groove, the upper electrical connector, and the connection element) between the display devices to align the display devices, thereby reducing the assembly time of the display apparatus 1. Moreover, when one of the display devices 20 is damaged, the damaged display device 20 may be directly removed, thereby improving the efficiency of repairing the display apparatus.

While the present disclosure has been described by way of example, it should be understood that the present disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A display apparatus, comprising:
    a fixing frame;
    a first display device disposed on the fixing frame, wherein the first display device comprises a first upper electrical connector;

a second display device disposed on the fixing frame, wherein the second display device comprises a first lower electrical connector and a first lower receiving part; and a movement element connected to the first upper electrical connector, wherein the first upper electrical connector is pushed by the movement element and movable between a storage position and a connection position, wherein the movement element is rotatable to push the first upper electrical connector, wherein when the first upper electrical connector of the first display device is electrically connected to the first lower electrical connector of the second display device, the first upper electrical connector is disposed in the first lower receiving part.

2. The display apparatus as claimed in claim 1, wherein the first upper electrical connector is disposed on a top portion of the first display device.

3. The display apparatus as claimed in claim 2, wherein the first lower electrical connector is disposed on a bottom portion of the second display device.

4. The display apparatus as claimed in claim 3, wherein the first lower receiving part is disposed on the bottom portion.

5. The display apparatus as claimed in claim 1, wherein the second display device comprises a second upper electrical connector disposed on a top portion of the second display device.

6. The display apparatus as claimed in claim 5, further comprising a third display device disposed on the fixing frame, wherein the third display device comprises a second lower electrical connector, and the second lower electrical connector is electrically connected to the second upper electrical connector of the second display device.

7. The display apparatus as claimed in claim 6, wherein the third display device comprises a second receiving part disposed on a bottom portion of the third display device, and the second lower electrical connector is disposed in the second receiving part.

* * * * *